United States Patent
Yu et al.

(10) Patent No.: US 8,322,299 B2
(45) Date of Patent: Dec. 4, 2012

(54) CLUSTER PROCESSING APPARATUS FOR METALLIZATION PROCESSING IN SEMICONDUCTOR MANUFACTURING

(75) Inventors: Chen-Hua Yu, Hsin-Chu (TW); Minghsing Tsai, Chu-Pei (TW); Yi-Li Hsiao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 941 days.

(21) Appl. No.: 11/419,933

(22) Filed: May 23, 2006

(65) Prior Publication Data

US 2007/0267461 A1    Nov. 22, 2007

Related U.S. Application Data

(60) Provisional application No. 60/747,442, filed on May 17, 2006.

(51) Int. Cl.
*B05C 13/00* (2006.01)
*B05C 15/00* (2006.01)
*C23C 16/00* (2006.01)
*C23F 1/00* (2006.01)
*H01L 21/306* (2006.01)

(52) U.S. Cl. ............ 118/66; 118/64; 118/719; 118/733; 156/345.31; 156/345.32

(58) Field of Classification Search .................. 118/719, 118/64, 66, 733; 156/345.31, 345.32; 414/935–941
See application file for complete search history.

(56) References Cited

U.S. PATENT DOCUMENTS

| | | | |
|---|---|---|---|
| 3,628,717 A | 12/1971 | Lynch et al. | |
| 4,718,975 A * | 1/1988 | Bowling et al. | 204/298.11 |
| 4,797,054 A * | 1/1989 | Arii | 414/217 |
| 5,303,482 A * | 4/1994 | Yamashita et al. | 34/80 |
| 5,620,560 A * | 4/1997 | Akimoto et al. | 216/41 |
| 5,876,280 A * | 3/1999 | Kitano et al. | 454/187 |
| 5,911,560 A | 6/1999 | Krueger et al. | |
| 5,993,165 A | 11/1999 | Lorimer et al. | |
| 6,165,328 A | 12/2000 | Lorimer et al. | |
| 6,178,660 B1 * | 1/2001 | Emmi et al. | 34/412 |
| 6,241,869 B1 | 6/2001 | Maeda | |
| 6,841,056 B2 * | 1/2005 | Preusse | 205/88 |
| 2002/0068524 A1 * | 6/2002 | Nakagawa | 454/187 |
| 2002/0074664 A1 | 6/2002 | Nogami | |

(Continued)

FOREIGN PATENT DOCUMENTS

CN    1170441    1/1998
(Continued)

OTHER PUBLICATIONS

Patentanwalte (Dutch Patent Office), Office Action dated Dec. 19, 2008. Germany.

(Continued)

*Primary Examiner* — Karla Moore
(74) *Attorney, Agent, or Firm* — Duane Morris LLP

(57) ABSTRACT

An apparatus includes an enclosure, at least one process chamber, a robot and at least one valve. The enclosure has a gas therein and at least one door configured to cover an opening into the enclosure. The gas includes at least one reduction gas. The robot is disposed within the enclosure and configured to transfer a substrate between the door and the process chamber. The valve is coupled to the enclosure.

22 Claims, 9 Drawing Sheets

U.S. PATENT DOCUMENTS

| | | | |
|---|---|---|---|
| 2003/0136514 A1* | 7/2003 | Biberger et al. | 156/345.31 |
| 2003/0194877 A1 | 10/2003 | Yau et al. | |
| 2004/0000486 A1 | 1/2004 | Preusse | |
| 2004/0222809 A1 | 11/2004 | Leedy | |
| 2005/0081785 A1* | 4/2005 | Lubomirsky et al. | 118/412 |
| 2005/0164497 A1 | 7/2005 | Lopatin et al. | |

FOREIGN PATENT DOCUMENTS

| | | |
|---|---|---|
| EP | 1182695 A2 | 2/2002 |
| EP | 1496542 A2 | 1/2005 |
| JP | 08-298288 | 11/1996 |
| JP | 2001-190945 | 1/2001 |
| JP | 2002-043315 | 2/2002 |
| JP | 2004-241420 | 8/2004 |
| JP | 2005-175068 | 6/2005 |
| WO | 2005038094 A2 | 4/2005 |

OTHER PUBLICATIONS

Eric Lebreton, "Confined Space", Transport Canada Canutec, pp. 1-5, at http://www.tc.gc.ca/canutec/en/articles/documents/confined.htm Mar. 28, 2006.

Translation of Official Action dated Aug. 31, 2009 from corresponding Japanese Application No. 2006-304358.

Singapore Patent Office; Official Action issued Mar. 11, 2010. •.

* cited by examiner

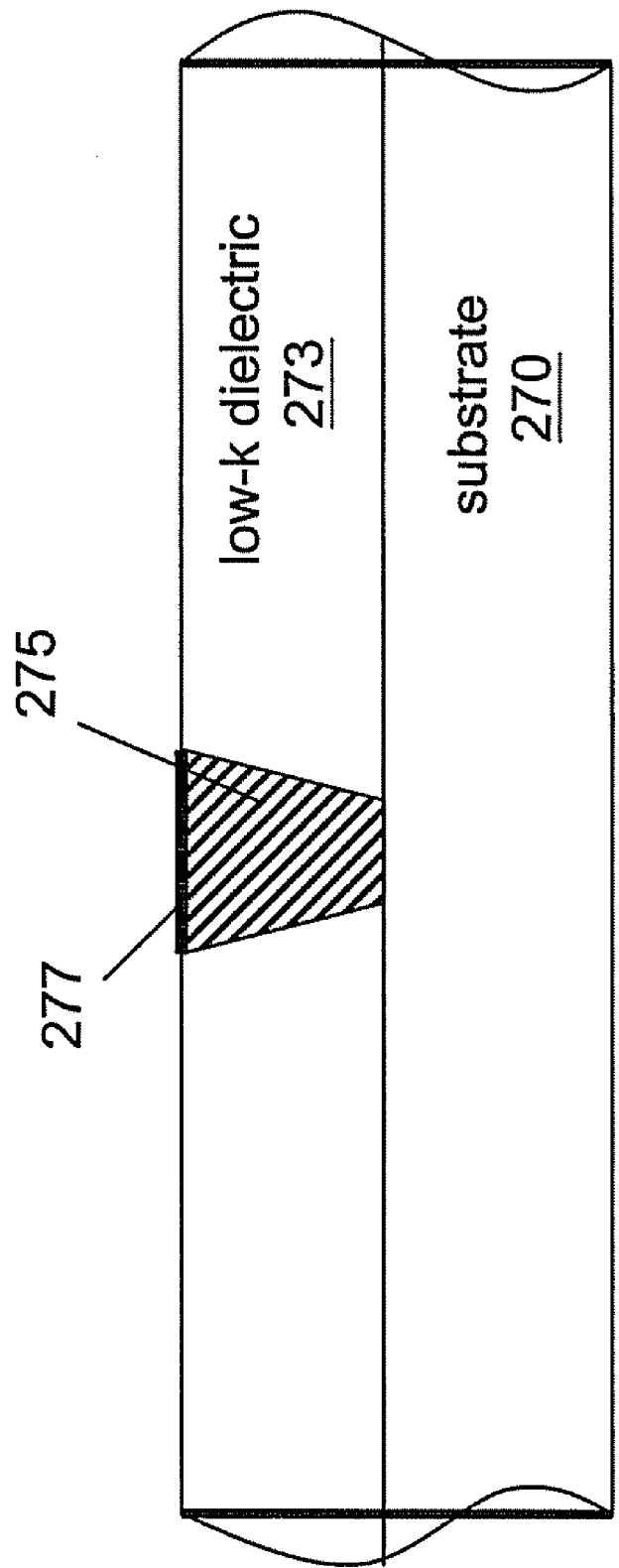

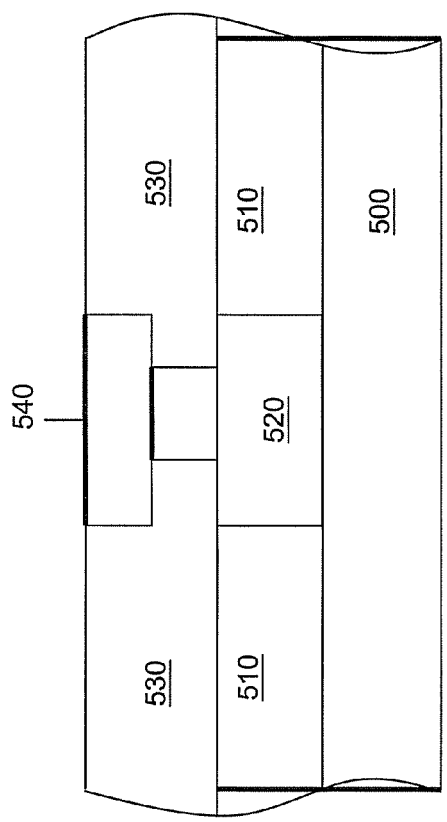
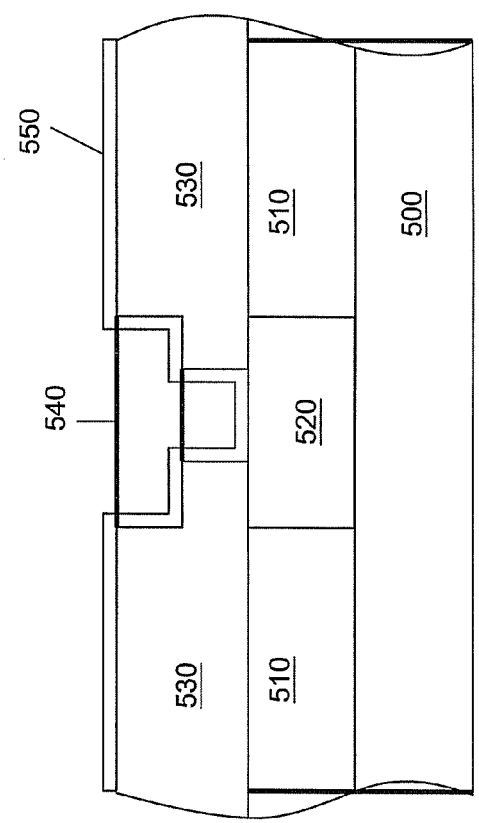
FIG. 5A
FIG. 5B

CLUSTER PROCESSING APPARATUS FOR METALLIZATION PROCESSING IN SEMICONDUCTOR MANUFACTURING

This application claims priority of the filing date of U.S. Provisional Patent Application No. 60/747,442 filed May 17, 2006, which provisional patent application is hereby formally incorporated by reference.

BACKGROUND OF THE INVENTION

1. Field of the Invention

The present invention relates to process apparatuses, and more particularly to cluster processing apparatuses for semiconductor wafers.

2. Description of the Related Art

With advances in electronic products, semiconductor technology has been applied widely in manufacturing memories, central processing units (CPUs), liquid crystal displays (LCDs), light emitting diodes (LEDs), laser diodes and other devices or chip sets. In order to achieve high integration and speed requirements, dimensions of semiconductor integrated circuits have been reduced and various materials, such as copper and ultra low-k dielectrics, have been used along with techniques for overcoming manufacturing obstacles associated with these materials and requirements.

FIG. 1 is a schematic cross-sectional drawing showing a traditional via hole structure. A copper layer 110 is formed over a substrate 100. A low-k dielectric layer 120 is formed over the copper layer 110. A copper via 130 is formed within the low-k dielectric layer 120. If the copper via 130 is exposed to air, the top surface of the copper via 130 reacts with oxygen in air, forming a copper oxide layer 140 due to oxidation. The copper oxide layer 140 can adversely affect the electrical connection between the top surface of the copper via 130 and a conductive layer (not shown) formed thereover. Accordingly, great care should be taken to avoid exposure to air during critical process steps, such as via opening, formation of copper seed layers, formation of copper layers, copper chemical mechanical polish (CMP) and formation of the ultra low-k dielectric material.

Traditionally, after a critical process step, the substrate 100 is removed from the process chamber that performs the critical process step and temporarily stored in a cassette or front opening unified pod (FOUP) until subsequent processing. When the door of the cassette or FOUP is removed to allow placement of the substrate 100 in the cassette or FOUP, air from the surrounding environment including oxygen flows into the cassette or FOUP. After the door is closed, the air is sealed within the cassette or FOUP with the substrate 100. As described above, oxygen tends to react with the copper layer 110 formed over the substrate 100 to form the copper oxide layer 140.

In order to address this problem, a "Q-time" is required after a critical process step is performed in the semiconductor manufacturing process. The next substrate process must be performed within a set predetermined time period or Q-time, such as from 2 to 4 hours. If a subsequent process, such as formation of a barrier layer, does not occur within the time period, a cleaning process is required to remove any copper oxide layer 140 formed over the copper layer 110.

Due to the high integration of semiconductor devices over substrate 100, a semiconductor process usually has a plurality of the critical steps each with an associated Q-time designed to protect the substrate. These Q-time requirements complicate the manufacturing processes. In addition, if a Q-time is missed, the required additional steps, such as for cleaning, increase process time and complexity.

By way of background, U.S. Patent Publication No. 2002/0074664 to Nogami et al. provides a description of a semiconductor manufacturing method, the entirety of which is hereby incorporated by reference herein. In this reference, a CoWP (cobalt tungsten phosphor) film is formed over a copper layer to prevent oxidation of the exposed copper layer. However, after the formation of the copper layer and before the formation of the CoWP film, the substrate including the copper layer is moved from the process chamber and exposed to the environment. A copper oxide layer forms over the copper layer before the formation of the CoWP film. The method of Nogami et al., therefore, cannot completely protect the copper layer from oxide formation.

From the foregoing, improved process apparatuses and methods are desired.

SUMMARY OF THE INVENTION

In accordance with some exemplary embodiments, an apparatus comprises an enclosure, at least one process chamber, a robot and at least one valve. The enclosure has a gas therein and at least one door configured to cover an opening into the enclosure. The gas includes at least one reduction gas. The robot is disposed within the enclosure and configured to transfer a substrate between the door and the process chamber. The valve is coupled to the enclosure.

The above and other features of the present invention will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

FIGS. 3A-3C are schematic cross-sectional views illustrating a process for removal of a copper oxide layer and formation of a cap layer over a copper via.

FIGS. 5A-5E are schematic cross-sectional views illustrating a process for a formation of a dual damascene structure.

DESCRIPTION OF THE PREFERRED EMBODIMENT

Figure 1:
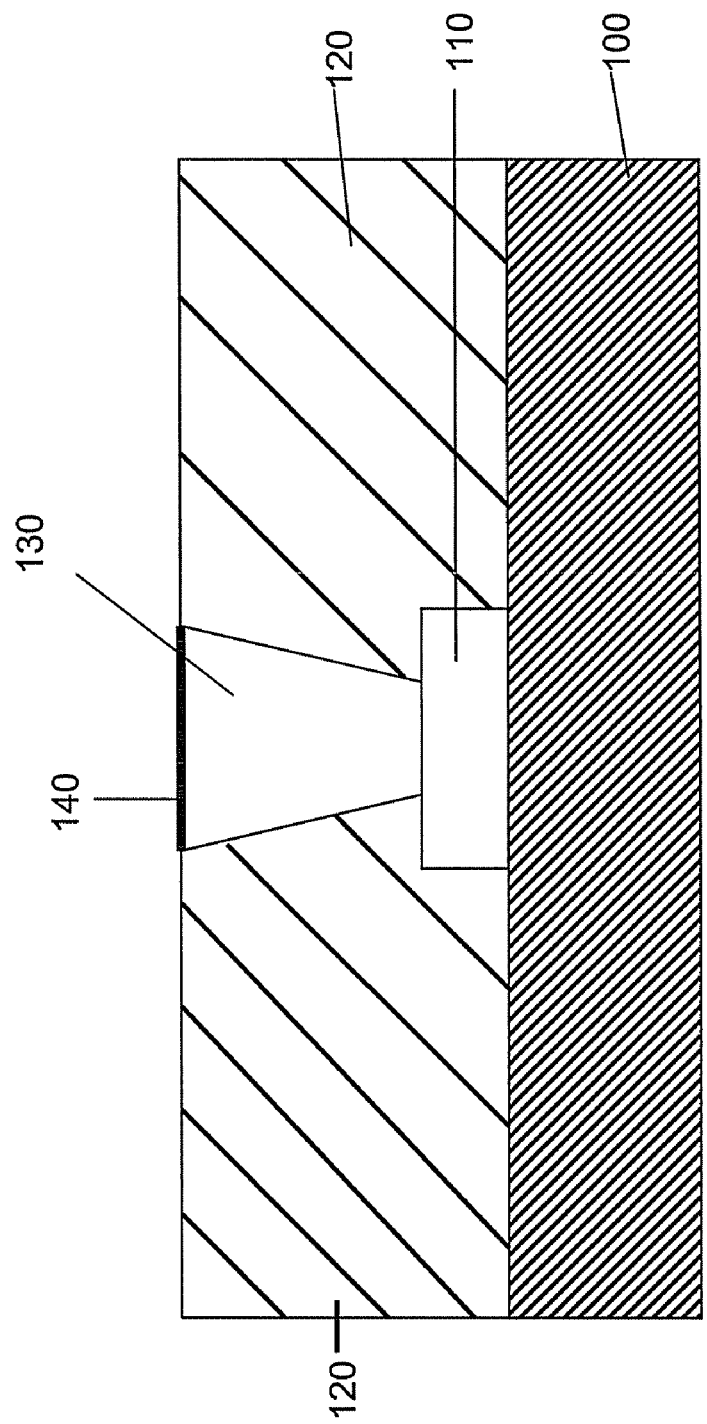
FIG. 1 is a schematic cross-sectional drawing showing a traditional via hole structure.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Figure 2:
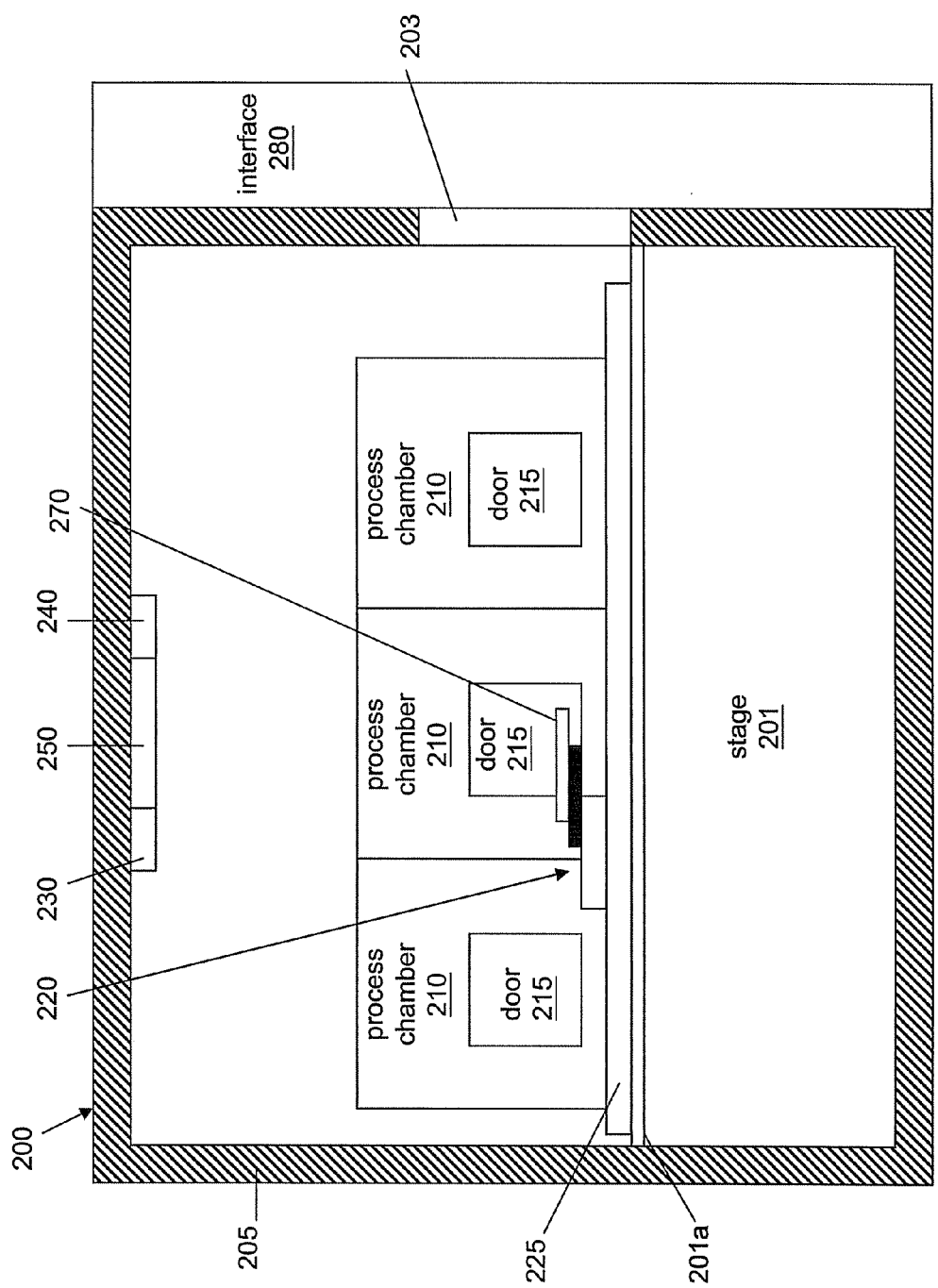
FIG. 2 is a schematic cross-sectional view of an exemplary cluster processing apparatus.

FIG. 2 is a schematic cross-sectional view of an exemplary cluster processing apparatus. The cluster processing apparatus includes an enclosure 200, at least one (and preferably a plurality of) process chamber 210, at least one robot 220 and one or more valves, such as valves 230 and 240. A stage 201, table or other support device (collectively referred to as "stage") is disposed within the enclosure 200 to support a robot 220, which carries a substrate 270, and process chambers 210. In one embodiment, the robot 220 travels along a rail or guide 225 disposed on the stage 201.

The enclosure 200 includes a sealed space having a gas therein. In some embodiments, the sealed space is enclosed by walls 205 of the enclosure 200 and a top surface 201a of the stage 201. The enclosure 200 also includes at least one door 203 configured to cover an opening into the enclosure 200. In some embodiments, the door 203 is disposed on or in at least one of the walls 205 of the enclosure 200. The door 203 is provided so that a substrate 270 can be properly transferred between the process chambers 210 and an interface 280. The robot 220 moves along the guide 225 from a position proximate to the door 203 to positions proximate to the process chambers 210, or between positions proximate to the process chambers 210. The robot 220 operates to transfer the substrate 270 among the process chambers 210 or between the process chambers 210 and the interface 280 through the door 203. In some embodiments, a plurality of robots 220 are provided within the enclosure 200 to enhance the transfer speed between the process chambers 210 or between the process chambers 210 and the interface 280.

At least one valve is provided within the enclosure 200. In some embodiments, the cluster processing apparatus includes a valve 230 and a release valve 240 for providing and exhausting the gas, respectively, to and from the enclosure 200. A pressure gauge 250 may be coupled to the valves 230 and 240 for use in control of the valves 230 and 240. In some embodiments, the valves 230 and/or 240 are coupled to at least one mass flow controllers (MFC) to control the removal rate, flow rate and/or the injection rate of the inert gas or the mixture gas. In some embodiments, the valve 240 is configured to control the pressure within the enclosure 200.

The substrate 270 is, for example, a wafer substrate, display substrate such as a liquid crystal display (LCD), plasma display, cathode ray tube display or electro luminescence (EL) lamp display, or light emitting diode (LED) substrate (collectively referred to as, substrate 270), for example.

The enclosure 200 includes a gas therein including at least one of a reduction gas and a non-reactive gas with respect to the substrate 270. A reduction gas can be provided to reduce or prevent oxide formation on the surfaces of the substrate 270 due to exposure of the substrate 270 during transfer of the substrate 270 among the process chambers 210 or between the process chambers 210 and the interface 280. The reduction gas is known to be a reducing agent that transfers electrons to another subject and is thus itself oxidized. The reduction gas is therefore an electron donor. The active reducing agent in the reduction gas itself becomes oxidized thereby reducing or preventing oxide formation as above. In some embodiments, the substrate 270 comprises an exposed copper layer (not shown in FIG. 2, but shown in FIG. 1) and the reduction gas comprises hydrogen ($H_2$), ammonia ($NH_3$), or other reduction gas or mixture thereof. The non-reactive gas component can comprise an inert gas such as helium (He), neon (Ne), argon (Ar), krypton (Kr), xenon (Xe), radon (Rn) or other gas such as nitrogen ($N_2$) that does not substantially react with the surfaces of the substrates 270 to form an oxide or other undesirable reaction. In some embodiments, the gas comprises a mixture of $N_2$ and $H_2$ in which $H_2$ is from of about 4% per volume to of about 10% per volume.

The amount of the reduction gas should be controlled to prevent explosion or other volatility if the selected reduction gas is volatile. For example, if $H_2$ is the reduction chemical within the enclosure 200, the amount of $H_2$ within the enclosure 200 should be equal to, or less than, about 4% per volume. One preferred amount of $H_2$ is between about 10 parts per million (ppm) to about 4% per volume with the remaining percentage composed of at least one non-reactive gas. In some embodiments, if $NH_3$ is the reduction chemical within the enclosure 200, the amount of $NH_3$ within the enclosure 200 is equal to, or less than, about 15.5% per volume. One preferred amount of $NH_3$ is between about 10 parts per million (ppm) to about 15.5% per volume with the remaining percentage composed of at least one non-reactive gas.

In one embodiment, the pressure within the enclosure 200 is maintained higher than the pressure of the environment surrounding the enclosure 200 in order to prevent or reduce gas flow from the surrounding environment into the enclosure 200. For example, if the environmental pressure is about 1 atm, the pressure within the enclosure 200 is maintained higher than about 1 atm. Accordingly, the pressure within the enclosure 200 can vary with the environmental pressure. In some embodiments, the pressure within the enclosure 200 is from about 1.0 atm to about 2.5 atm.

In some embodiments, the gas within the enclosure 200 can leak or flow into the environment surrounding the enclosure 200. If the gas is hazardous to humans, such as $NH_3$, the gas within the enclosure 200 is controlled so that the leakage of the gas does not result in harmful levels in the environment. For example, with $NH_3$ the levels should be maintained below 25 ppm in the environment. The amount of the gas, e.g., $NH_3$, within the enclosure 200 may also be adjusted to eliminate this concern.

In some embodiments, the enclosure 200 is connected to an interface 280. The interface 280 is adapted to allow transfer of the substrate 270 to a carrier (not shown), such as a cassette or front opening unified pod (FOUP), coupled to the interface 280, as described in, for example, commonly assigned and copending U.S. Provisional Patent Application Ser. No. 60/747,445, filed on May 17, 2006, the entirety of which is hereby incorporated by reference herein. The pressure and gas conditions within the interface 280 may be substantially similar to, or different from, those within the enclosure 200.

The valve 230 and the valve 240 are disposed on one of the walls 205 of the enclosure 200. The valve 230 is operable to inject a gas, such as a gas including the reduction gas, into the enclosure 200 from a source or sources (not shown) to adjust the level of the gas and/or pressure therein when a pressure within the enclosure 200 is lower than a predetermined pressure, such as 1 atm. In some embodiments, the gas introduced by the valve 230 comprises a mixture of $N_2$ and $H_2$ in which $H_2$ is from of about 4% per volume to of about 10% per volume. The valve 240 is operable to exhaust the gas from the enclosure 200 to adjust the pressure therein when the pressure within the enclosure 200 is higher than another predetermined pressure, such as 2.5 atm. Rather than utilizing both valves 230 and 240, in some embodiments, only one valve 230 or 240 is used. In such embodiments, the valve 230 or 240 can inject the gas into the enclosure 200 when the pressure within the enclosure 200 is lower than a predetermined pressure and exhaust the gas from the enclosure 200 when the pressure within the enclosure 200 is higher than a predetermined pressure.

In some embodiments, the pressure gauge 250 is coupled to the valve 230, valve 240 or both so that the pressure gauge 250 sends a signal to trigger the valve 230 to inject the gas into the enclosure 200 and the valve 240 to exhaust the gas from the enclosure 200. In other embodiments, the valve 230 and the valve 240 are time set to inject and exhaust the gas, respectively, or the valves 230 and 240 are themselves pressure sensitive or include integral gauges.

In some embodiments, the pressure gauge 250 or gauges senses the pressures within and outside the enclosure 200. If the pressure within the enclosure 200 is higher than the pressure outside the enclosure 200 by a predetermined amount, the pressure gauge 250 sends a signal to trigger the valve 240 to release the mixture gas within the enclosure 200 until the desired pressure differential is reached.

The valve 230 can be used to inject the reduction gas or a mixture containing the reduction gas. Of course, one or more injection valves 230 can be provided for injecting the desired gas or gasses and from the same or multiple sources, as long as the pressure and/or volume percentage of the mixture gas within the enclosure 200 are maintained in such a guide as described above.

In embodiments where the valve 230 provides a reduction gas to the enclosure 200, in order to speed delivery of the reduction gas into enclosure 200, the valve 230 is disposed proximate to a top region of the enclosure 200 when the molecular weight of the reduction gas is larger than the molecular weight of the gas within the enclosure 200. For example, assume that the reduction gas injected from the valve 230 is $NH_3$ and the mixture gas within the enclosure 200 is a mixture of $NH_3$ and He. The molecular weight of $NH_3$ is 17 and the molecular weight of He is 2. If the gas comprises 10% $NH_3$ and 90% He, the molecular weight of the gas is about 3.5 which is less than 17. Thus, the valve 230 is disposed proximate to the top region of the enclosure 200 so that $NH_3$ efficiently diffuses into the enclosure 200 when the valve 230 is actuated. Conversely, the valve 230 is disposed proximate to the bottom region of the enclosure 200 if the molecular weight of the reduction gas is less than the molecular weight of the mixture gas within the enclosure 200. For example, assume that the reduction gas comprises $H_2$ and the mixture gas within the enclosure 200 comprises a mixture of $H_2$ and nitrogen. The molecular weight of $H_2$ is 2 and the molecular weight of nitrogen is 28. If the gas comprises 1% $H_2$ and 99% nitrogen, the molecular weight of the gas is about 27.74 which is larger than 2. Thus, the reduction gas from the valve 230 disposed proximate to the bottom region of the enclosure 200 efficiently diffuses within the enclosure 200 when the valve 230 is actuated. Note that the "top region" is not limited to the top wall as shown in FIG. 2. The top region can mean the top portion of the sidewall 205 of the enclosure 200. Also, the bottom region can mean the bottom portion of the sidewall 205 of the enclosure 200. In some embodiments, the valve 230 is configured within the stage 201 and the reduction gas is released into the enclosure 200 through openings (not shown) within the top surface of the stage 201.

The configuration of the valve 230 and the valve 240 is not limited to the descriptions provided above and shown in the figures. As long as the gas can be provided into the enclosure 200 in a manner that efficiently prevents oxidation or other chemical reactions to the substrate 270, the valve 230 and the valve 240 can be disposed at any desired location.

In some embodiments, the enclosure 200 is in an initial condition with a pressure of about 1 atmosphere, and air and moisture, for example. Such initial condition is undesired and a desired condition within the enclosure 200 described above should be achieved. In some embodiments, at least one purging step and pumping step are provided to obtain a desired condition. A purging step introduces a reduction gas or a mixture set forth above into the enclosure 200. A pumping step exhausts air or gas from the enclosure 200. In some embodiments, a pumping step performed, for example, by the valve 240, exhausts air from the enclosure 200 so that the pressure within the enclosure 200 is reduced to a predetermined pressure, such as 0.7 atm. The pumping step then stops and a purging step performed by, for example, the valve 230 introduces a reduction gas or a mixture gas into the enclosure 200. In some embodiments, the purging step and pumping step are repeated for several times to achieve a desired condition with the enclosure 200.

In still other embodiments, a purging step and a pumping step are performed simultaneously so that air within the enclosure 200 can be efficiently exhausted therefrom. In the embodiments, if the valve 230 introduces a reduction gas, such as $H_2$, into the enclosure 200, the valve 230 can be configured at the top portion of the enclosure 200 and the valve 240 can be configured at the bottom portion of the enclosure 200, because $H_2$ (molecular weight 2) is lighter than air (molecular weight about 29) and air can be more effectively exhausted by the valve 240 configured at the bottom portion of the enclosure 200. If the valve 230 introduces a mixture of gases, such as $H_2$ and Kr (molecular weight 36), heavier than air (molecular weight about 29) into the enclosure 200, the valve 230 can be configured at the bottom portion of the enclosure 200 and the valve 240 can be configured at the top portion of the enclosure 200 to more efficiently exhaust air from the enclosure 200. In some embodiments, the purging step and pumping steps can be performed by switching gases supplied to the valves 230 and 240. For example, as set forth above in paragraph [0029], the valve 230 is configured at the bottom portion of the enclosure 200 to introduce a mixture including $H_2$ and the valve 240 is configured at the top portion of the enclosure 200 to maintain a desired condition within the enclosure 200. For removing the initial condition within the enclosure 200, the purging step is performed by the valve 240 to introduce $H_2$ into the enclosure 200 and the pumping step is performed by the valve 230.

The process chambers 210 include respective doors 215. In some embodiments, the process chambers 210 include apparatuses for a metal processing and/or cap layer formation. A chamber may be a wet or dry process chamber. In one embodiment, the process chambers 210 include apparatuses for forming the via shown in FIG. 1. In some embodiments, the chamber for metal processing includes at least one of a wet clean bench (such as a scrubber), a metal reduction wet bath (such as a copper reduction wet bath), a metal reduction dry chamber (such as a copper reduction dry chamber), a metal plating bath (such as a copper electrical plating bath or a copper electroless plating bath), a dry etch chamber, a metal polish apparatus (such as a chemical mechanical polishing (CMP) apparatus), a low-k dielectric deposition apparatus (such as a chemical vapor deposition (CVD) apparatus, a spin-on dielectric (SOD) apparatus or a low-pressure CVD (LPCVD)), an thermal treatment apparatus (such as an anneal chamber) or other chamber which forms or exposes material on the substrate that may react if exposed to the environment. In some embodiment, the cap layer formation chamber can form, for example, a layer of cobalt silicide, titanium silicide, titanium nitride, titanium/titanium nitride, tantalum, tantalum nitride, tungsten silicide or other material that is formed over a metal-containing layer to protect the layer from oxidation.

Figure 3A:
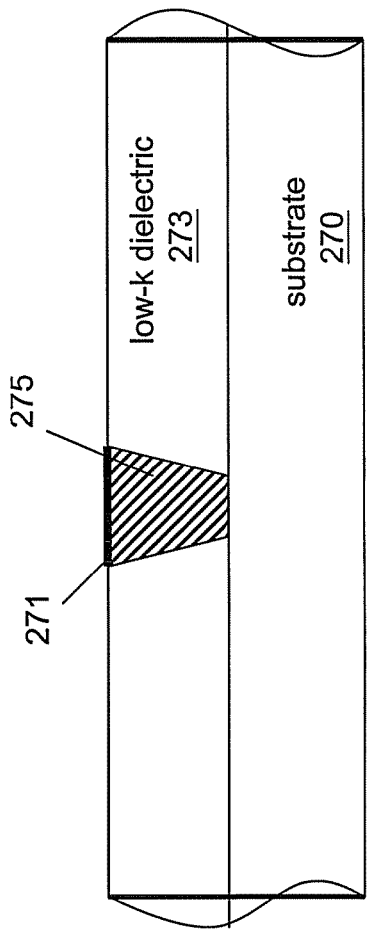
Figure 3B:
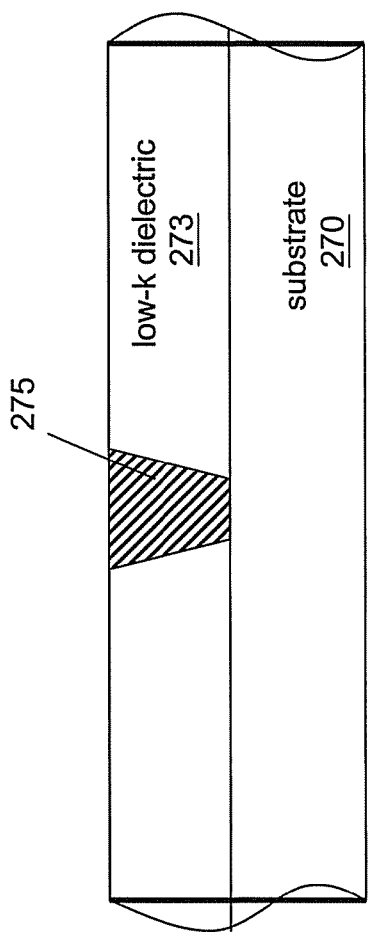

FIGS. 3A-3C are schematic cross-sectional views showing the removal of a copper oxide layer and formation of a cap layer over a copper via. Referring to FIG. 3A, a low-k dielectric layer 273 forms over a substrate 270. A copper via 275 is formed within the low-k dielectric layer 273 in a copper electrical plating apparatus that is not disposed within the enclosure 200. The substrate 270 is then moved from the copper electrical plating apparatus and stored within a carrier (not shown) as described in connection with FIG. 1. Because the substrate 270 is not protected by the gas within the carrier, a copper oxide layer 271 forms over the copper via 275 after the copper via 275 is exposed to the environment. The copper oxide layer 271 will adversely affect an electrical connection between the copper via 275 and a metal layer (not shown) formed thereover. In order to remove the copper oxide layer 271, the carrier carrying the substrate 270 is connected to the interface 280 and the substrate 270 is transferred from the interface 280 through the door 203 to the enclosure 200 by the robot 220 as shown in FIG. 2. The substrate 270 is then transferred to one of the process chambers 210, such as a copper reduction chamber, within the enclosure 200 by the robot 220. The copper reduction chamber performs a copper reduction process on the copper oxide layer 271 formed over the substrate 270 so that the copper oxide layer 271 is removed as shown in FIG. 3B. The substrate 270 is then moved from the reduction chamber and into another chamber 210, such as a cap layer formation chamber, disposed within the enclosure 200 by the robot 220. During the transfer between the two process chambers 210, the substrate 270 is exposed to the gas within the enclosure 200 as set forth above. The exposed copper via 275 is protected from oxidation during this transfer between the process chambers 210 by the gas in the enclosure 200. Then, a cap layer formation chamber forms a cap layer 277, such as a cobalt silicide layer, over the copper via 275 as shown in FIG. 3C. The cap layer 277 protects the top surface of the copper via 275 from exposure to the environment when the substrate 270 is transferred out of the cluster chamber enclosure 200 through the interface 280 into a carrier. After the formation of the cap layer 277, the substrate 270 is moved from the cap layer formation chamber by the robot 220. The substrate 270 is then transferred to the interface 280 and stored in the carrier connected to the interface 280.

Rather than utilizing a metal reduction chamber, in some embodiments, the copper oxide layer 271 is removed by a CMP apparatus that is disposed within the enclosure 200. After the removal of the copper oxide layer 271, the substrate 270 is transferred by the robot 220 into a cap layer formation chamber for forming the cap layer 277 as described above. Because the transfer of the substrate 270 is performed within the enclosure 200, the copper via 275 is protected from oxidation. The cap layer 277 is then formed over the copper via 275 and protects the copper via 275 from exposure within the environment.

In still other embodiments, one of the process chambers 210 can be, for example, a metal plating chamber such as copper electrical or electroless plating chamber that is disposed within the enclosure 200. The copper via 275 is formed by the copper plating chamber without being exposed to the environment. The substrate 270 is then moved from the copper plating chamber by the robot 220 and into the cap layer formation chamber. Because the transfer of the substrate 270 is performed within the enclosure 200, the copper via 275 is protected from oxidation. The cap layer 277 is then formed over the copper via 275 as set forth above and protects the copper via 275 from exposure to the surrounding environment when removed from the enclosure 200.

Still further, in some embodiments, the enclosure 200 can also include a metrology apparatus to measure physical or electrical properties of material layers formed over substrates 270. Because the transfer of the substrate 270 is performed within the enclosure 200, the material layer is protected from oxidation. Therefore, the formation of material layers and measurement of physical or electrical properties of material layers can be performed within the enclosure 200 without the concern for oxidation of the material layer.

Figure 4A:
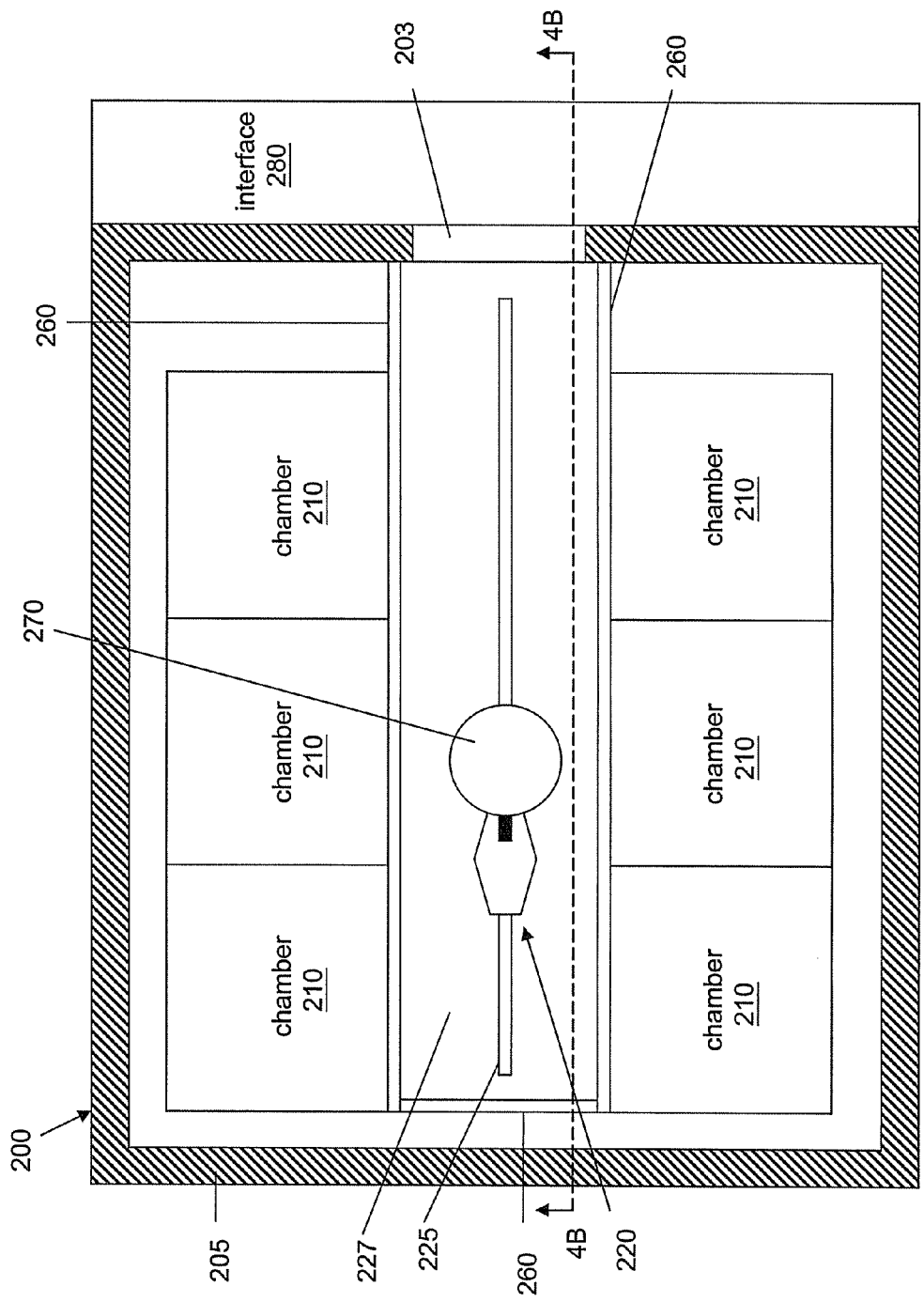
FIG. 4A is a schematic top view of one embodiment of an exemplary cluster processing apparatus.
Figure 4B:
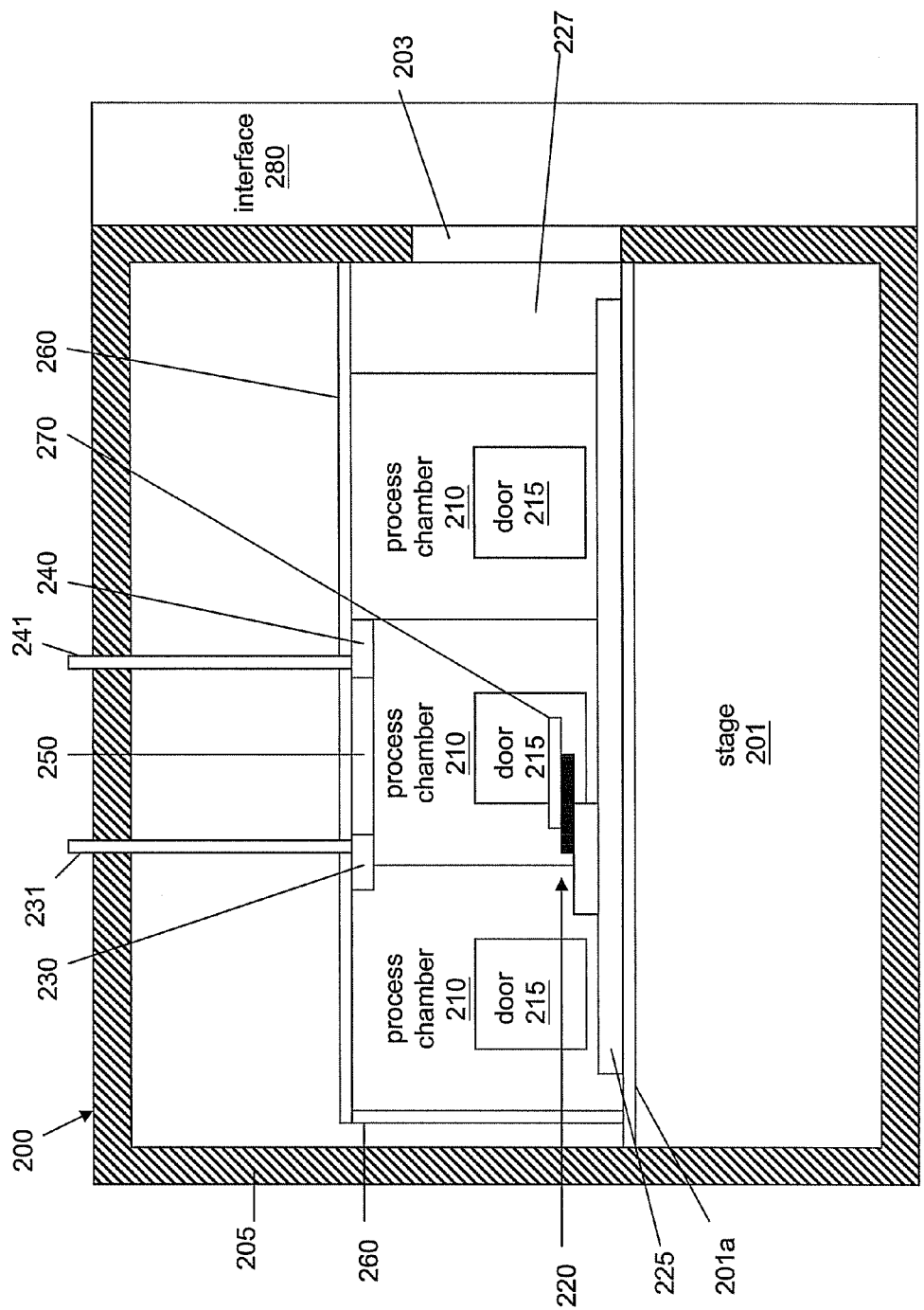
FIG. 4B is a schematic cross-sectional view of the exemplary cluster processing apparatus of FIG. 4A taken along line 4B-4B.

FIG. 4A is a schematic top view of another embodiment of an exemplary cluster processing apparatus. FIG. 4B is a schematic cross-sectional view of the exemplary cluster processing apparatus of FIG. 4A taken along line 4B-4B.

Referring to FIGS. 4A and 4B, a region 227 is defined between two rows of the process chambers 210 and sealed from remaining portions of the enclosure 200 with a shield or cover structure 260. The shield structure 260 seals the region 227 in which the robot 220 is moveable over the guide 225. The shape of the guide 225 can be, for example, a line track, parallel-line track, U-shape track, O-shape track, 8-shape track, serpentine track or other shape defined so that the robot 220 can properly transfer the substrate 270 between the process chambers 210 or between the process chambers 210 and the interface 280. In some embodiments, the robot 220 can be, for example, a robot arm that is disposed within the enclosure 200 or the shield structure 260. The robot arm is operable to transfer substrates 270 among the process chambers 210 or between the process chambers 210 and the interface 280 without a track.

Referring to FIG. 4B, the valve 230, release valve 240 and pressure gauge 250 are disposed within the shield structure 260. In this embodiment, pipes or conduits 231 and 241 are connected to the valve 230 and release valve 240, respectively. The pipe line 231 provides the mixture gas or reduction gas described in connection with FIG. 2 to the valve 230. The pipe line 241 exhausts the mixture gas or reduction gas from the release valve 240. In some embodiments, the pipe line 241 is coupled to a pressure controller (not show) for controlling pressure release within the shield structure 260. The considerations for positioning the valve 230, release valve 240 and pressure gauge 250 within the shield structure 260 can be the same as those described above in connection with FIG. 2.

Providing a shield structure 260 can reduce manufacturing and operating costs as the space that is maintained under the desired pressure/gas conditions as set forth above is reduced. The shield structure 260 is not limited to the configuration shown in FIGS. 4A-4B. In some embodiments, the shield structure 260 may cover not only the region 227 shown in FIGS. 3A-3B, but also the process chambers 210. The region 227 is enclosed by the shield structure 260 and the top surface of the 201*a* of the stage 201. For example, the space enclosed by the shield structure 260 may be larger than that of the region 227, but smaller than that of the enclosure 200. The shield structure 260 need only cover the region 227 in such a way that the robot 220 can properly transfer the substrate 270 among the process chambers 210 or between the process chambers 210 and the interface 280 while sealing the areas from the remaining portion of the enclosure 200.

FIGS. 5A-5E are schematic cross-sectional views showing a formation of a dual damascene structure.

Referring to FIG. 5A, a dielectric layer 510 is formed over a substrate 500. A conductive layer 520 is formed within the dielectric layer 510. A dielectric layer 530 with an opening 540 including a via and a trench is formed over the dielectric layer 510 to partially expose a top surface of the conductive layer 520. The dielectric layer 510 and the substrate 500 are similar to the dielectric layer 273 and the substrate 270 as described above. The conductive layer 520 can be, for example, a copper layer, aluminum copper layer, aluminum layer or other conductive layer that is subjected to oxidation if exposed to air. The dielectric layer 530 can be, for example, an oxide layer, nitride layer, oxynitride layer, low-k dielectric layer, extreme low-k (ELK) dielectric layer or other dielectric layer that can isolate different conductive layers.

A barrier layer 550 is then formed substantially conformal over the dielectric layer 530 and the opening 540 as shown in FIG. 5B. The barrier layer 550 can be, for example, a tantalum (Ta) layer, tantalum nitride (TaN) layer, titanium (Ti) layer, titanium nitride (TiN) layer or other material layer. The barrier layer 550 can be formed by, for example, a PVD apparatus or CVD apparatus.

Figure 5C:
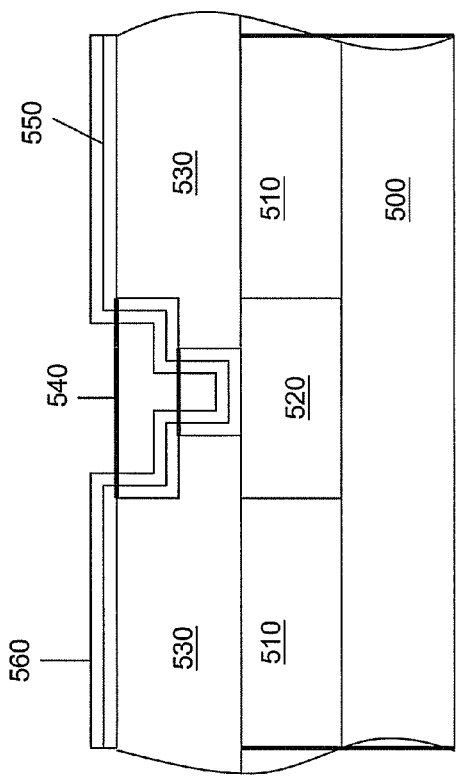

A substantially conformal seed layer 560 is then formed over the barrier 550 as shown in FIG. 5C. The seed layer 560 is a layer formed for a subsequent chemical plating process to form a metal-containing layer, such as a copper layer, thereover. The seed layer 560 can be, for example, a thin copper layer formed by a PVD apparatus.

Figure 5D:
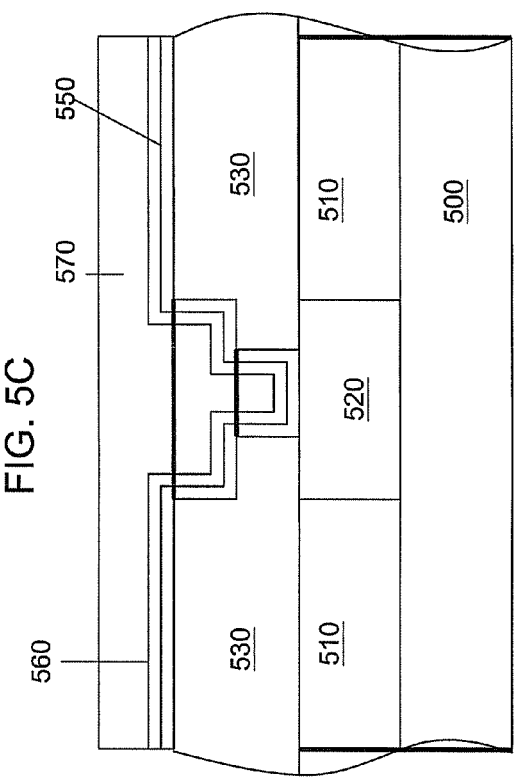
Figure 5E:
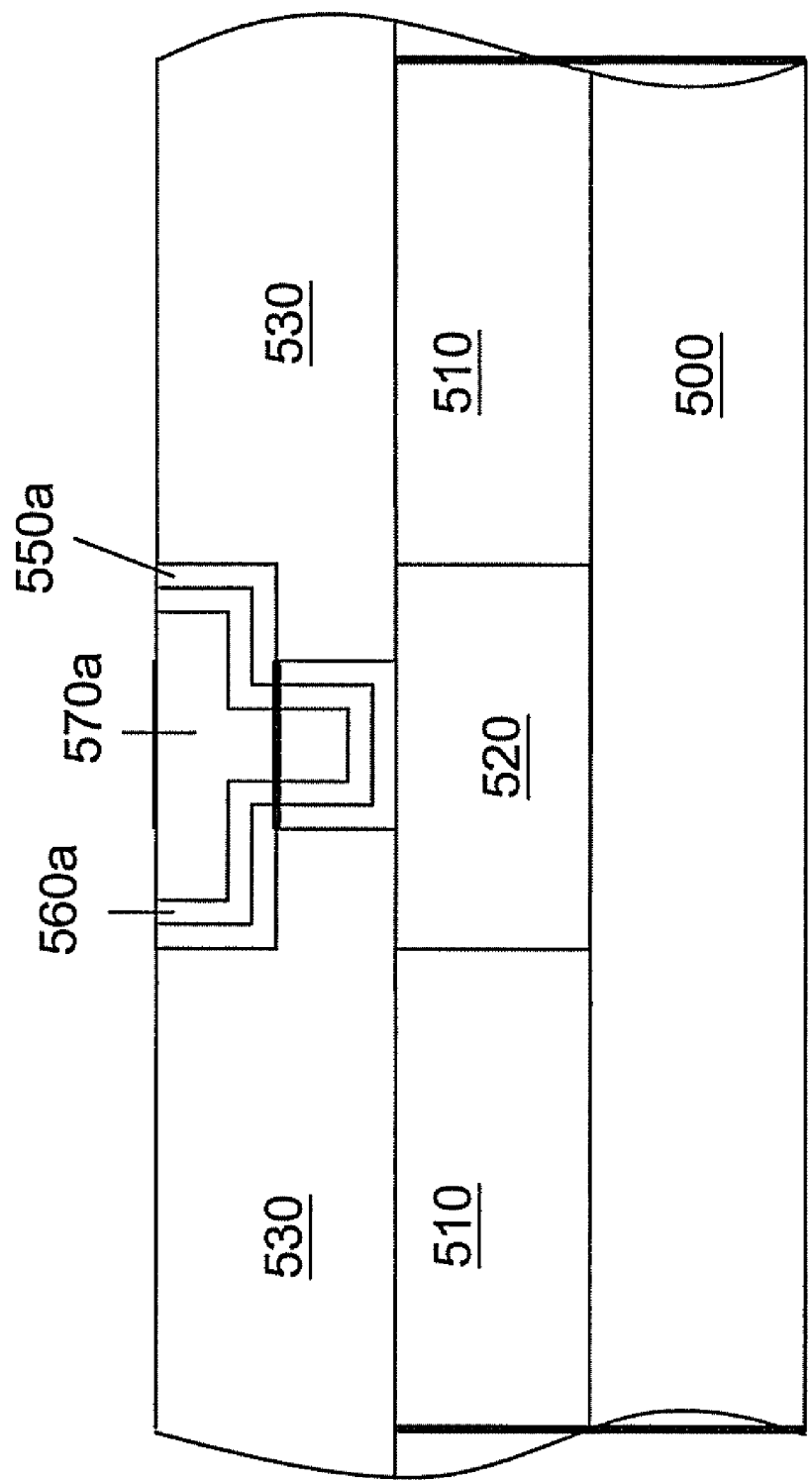

A layer of material 570, such as copper is formed over the seed layer 560 as shown in FIG. 5D. The layer of material 570 can be formed, for example, by an electro-chemical plating apparatus or an electroless chemical plating apparatus.

Portions of the barrier layer 550, seed layer 560 and layer of material 570 are removed for the formation of a dual damascene structure including the barrier layer 550a, seed layer 560a and conductive layer 570a. The process for removing the portions of the barrier layer 550, seed layer 560 and layer of material 570 can be, for example, a chemical-mechanical polish (CMP) process or an etch process.

In a traditional process, after the formation of the opening 540 shown in FIG. 5A, the substrate 500 is transferred from an etch apparatus to a PVD apparatus for the deposition of the barrier layer 550 (shown in FIG. 5B). During the transfer between the etch apparatus to the PVD apparatus, the top surface of the conductive layer 520 is exposed to the environment and oxide forms thereon. Thus, a pre-clean process is used to remove the oxide formed on the top surface of the conductive layer 520. Further, because the dielectric layer 530, such as low-k dielectric layer, is exposed to the environment, the dielectric layer 530 absorbs moisture within the environment. Thus, in a traditional process the structure shown in FIG. 5A should be subjected to a degas process to remove moisture from the dielectric layer 530 before the deposition of the barrier layer 550. By the usage of the enclosure 200 set forth above, the processes described in FIGS. 5A and 5B can both be performed within the enclosure 200 as set forth in connection with FIGS. 2, 4A and 4B. Because the enclosure 200 includes a reduction gas or a mixture of a reduction gas and nitrogen or inert gas, the top surface of the conductive layer 520 and the dielectric layer 530 are not exposed to the environment. Accordingly, the pre-clean process and the degas process can be saved.

Further, in a traditional process a "Q-time" target is used after the formation of the seed layer 560 (shown in FIG. 5C) and before the formation of the layer of material (provided to form the conductive layer 570 shown in FIG. 5D). The "Q-time" target is from about 4 hours to about 6 hours to prevent too much undesired oxidation occurring on the top surface of the seed layer 560. However, the use of the enclosure 200 can save the "Q-time" target and relax the process flow shown in FIGS. 5A-5D.

Also, after the removal of the portions of the barrier layer 550, seed layer 560 and layer of material 570, the substrate 500 is transferred from, for example, a CMP chamber to a CVD chamber to form a dielectric layer over the dual damascene structure. In a traditional process, the top surfaces of the conductive layer 570a and the dielectric layer 530 are exposed to the environment during the transfer of the substrate 500. Another pre-clean process and degas process are used to remove the oxide forming on the top surface of the conductive layer 570a and to remove moisture from the dielectric layer 530, respectively. As set forth above, the CMP process and the subsequent CVD process can be performed within the enclosure 200. The substrate 500 thus can be transferred within the enclosure 200 without being exposed to the environment. Accordingly, the pre-clean process and the degas process can be saved.

By removing the pre-clean processes, degas processes and/or the "Q-time" target from a traditional process as described above, the process time of formation of integrated circuits can be reduced and the process flow becomes more flexible. In addition, because the pre-clean processes, degas processes and/or the "Q-time" target are not used, apparatuses or chambers for the pre-clean and degas processes and/or stockers to store substrates under "Q-time" target can be saved. With the reduction of the number of equipment, a space of a factory can be substantially reduced by, for example, one third.

In some embodiments, the enclosure 200 can cooperate with the carrier and the facility interface described in, for example, commonly assigned and copending U.S. Provisional Patent Application Ser. No. 60/747,445, filed on May 17, 2006. By the combination of the carrier, facility interface and enclosure 200, the desired result as described above and an apparatus with cluster processing chambers can be more effectively achieved.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A cluster processing apparatus, comprising:
   means for causing a reduction reaction and reducing oxide formation on an exposed metal surface of a substrate when the substrate is inside an enclosure and outside of process chambers with doors that are disposed in the enclosure; and
   means for transferring a substrate between the process chambers within the enclosure, wherein the means for transferring a substrate between the process chambers within the enclosure further comprises a shield structure enclosing a path traversed by the substrate between the process chambers.

2. The apparatus of claim 1, wherein the process chambers include at least a chamber for metal processing and a cap layer formation chamber and the means for causing a reduction reaction uses a processing gas comprising a reduction gas that includes an active reducing agent that reduces oxide formation on exposed metal surfaces.

3. The apparatus of claim 2, wherein the chamber for metal processing comprises at least one of a wet clean bench, a metal reduction wet bench, a metal reduction dry chamber, a metal plating bath, a dry etch chamber, a metal polish apparatus and a low-k dielectric deposition chamber.

4. The apparatus of claim 2, wherein the cap layer formation chamber forms a layer of cobalt silicide, tungsten silicide, titanium silicide, titanium nitride, titanium/titanium nitride, tantalum or tantalum nitride.

5. The apparatus of claim 2, wherein the reduction gas comprises ammonia ($NH_3$) equal to or less than about 15.5% per volume.

6. The apparatus of claim 2, wherein the processing gas further comprises a non-reactive gas comprising at least one of an inert gas and nitrogen.

7. The apparatus of claim 1, wherein the means for causing a reduction reaction includes at least a first valve and a second valve, the first valve operable to inject a processing gas into the enclosure if a pressure within the enclosure is lower than a first predetermined pressure level, and the second valve operable to exhaust the processing gas from the enclosure if the pressure within the enclosure is higher than a second predetermined pressure level.

8. The apparatus of claim 7, wherein the first predetermined pressure level is about 1 atm and the second predetermined pressure level is about 2.5 atm.

9. The apparatus of claim 1, further comprising at least one injection valve positioned proximate to a bottom region of the enclosure.

10. The apparatus of claim 1 further comprising means coupled to the enclosure for maintaining the pressure within the enclosure within a selected pressure range.

11. The apparatus of claim 1, wherein the process chambers are arranged in two rows and wherein the means for transferring a substrate includes a robot that is moveable over a guide that extends between the two rows.

12. The apparatus of claim 11, wherein the shield structure enclosing a path traversed by the robot and wherein the guide comprises one of a line track, parallel-line track, U-shape track, O-shape track, 8-shape track, and a serpentine track.

13. A cluster processing apparatus, comprising:
a sealed enclosure and at least one door configured to cover an opening into the sealed enclosure;
process chambers including at least one copper reduction wet bench and at least one cap layer formation chamber disposed within the sealed enclosure, the process chambers arranged in rows and including respective doors;
a robot disposed within the enclosure, moveable over a guide that extends between the rows and configured to transfer a substrate from the door to the process chambers and/or between the process chambers;
valves configured to direct an ammonia gas that causes a reduction reaction between the ammonia gas and an exposed metal surface of the substrate when the substrate is inside the sealed enclosure and outside of the plurality of process chambers; and
at least one pressure gauge coupled to the sealed enclosure, wherein the rows comprise two parallel rows and further comprising a shield structure enclosing a path traversed by the robot.

14. The apparatus of claim 13, wherein the cap layer formation chamber is adapted to form cobalt silicide, tungsten silicide, titanium silicide, titanium nitride, titanium/titanium nitride, tantalum or tantalum nitride.

15. The apparatus of claim 13, further comprising a valve positioned proximate to a bottom region of the enclosure.

16. The apparatus of claim 13, wherein the ammonia is equal to or less than about 15.5% per volume of a processing gas that further comprises at least one of an inert gas and nitrogen.

17. The apparatus of claim 13 further comprising a shield structure enclosing the area of the enclosure having processing the gas to cover a path traversed by the robot between the chambers, wherein the valve is disposed on a wall of the shield structure.

18. The apparatus of claim 13, wherein one of said valves is a valve positioned proximate to a top region of the sealed enclosure.

19. The apparatus of claim 13, wherein the guide comprises one of a line track, parallel-line track, U-shape track, O-shape track, 8-shape track, and a serpentine track.

20. The apparatus of claim 13, wherein the valves include a first valve and a second valve disposed within the sealed enclosure, wherein the first valve is operable to inject a processing gas into the sealed enclosure when a pressure within the sealed enclosure is lower than about 1 atm, and the second valve is operable to exhaust the processing gas from the sealed enclosure when the pressure within the sealed enclosure is higher than about 2.5 atm; the processing gas including the ammonia.

21. A cluster processing apparatus comprising:
means for causing a reduction reaction and reducing oxide formation on an exposed metal surface of a substrate when the substrate is inside a sealed enclosure and outside of process chambers with doors that are disposed in the sealed enclosure;
means for transferring a substrate along a rail between the process chambers and an enclosure door configured to cover an opening into the sealed enclosure, within the sealed enclosure;
means for shielding the rail.

22. The cluster processing apparatus as in claim 21, wherein the process chambers include at least one copper chemical reduction apparatus and at least one cap layer formation apparatus and wherein said means for shielding does not shield or cover said at least one copper chemical reduction apparatus or said at least one cap layer formation apparatus.

* * * * *